United States Patent [19]
Creeden

[11] Patent Number: 5,453,702
[45] Date of Patent: Sep. 26, 1995

[54] AUTOMATIC PROBE FIXTURE LOADING APPARATUS WITH GIMBALLING COMPENSATION

[75] Inventor: Joseph M. Creeden, Alto Loma, Calif.

[73] Assignee: Methode Electronics, Inc., Chicago, Ill.

[21] Appl. No.: 172,034

[22] Filed: Dec. 22, 1993

[51] Int. Cl.⁶ .................................................. H05K 3/00
[52] U.S. Cl. .......................... 324/761; 324/754; 29/729; 29/837; 29/845
[58] Field of Search .......................... 29/705, 729, 837, 29/845; 324/754, 761

[56] References Cited

U.S. PATENT DOCUMENTS

| | | | |
|---|---|---|---|
| 3,996,516 | 12/1976 | Luther | 324/158 |
| 4,208,783 | 6/1980 | Luther et al. | 29/593 |
| 4,245,940 | 1/1981 | Luther et al. | 414/95 |
| 4,273,321 | 6/1981 | Luther et al. | 271/10 |
| 4,352,061 | 9/1982 | Matrone | 324/158 |
| 4,417,204 | 11/1983 | Dehmel et al. | 324/73 |
| 4,535,536 | 8/1985 | Wyss | 29/845 |
| 4,749,943 | 6/1988 | Black | 324/158 F |
| 4,803,424 | 2/1989 | Ierardi et al. | 324/158 |
| 5,247,246 | 9/1993 | Van Loan et al. | 324/158 |

*Primary Examiner*—Kenneth A. Wieder
*Assistant Examiner*—Mark Wardas
*Attorney, Agent, or Firm*—David L. Newman

[57] ABSTRACT

An automatic fixture loading apparatus which provides for the rapid loading of probes into the bottom plate of a test fixture comprising a replenish station, an elevator storage station having means for storage of at least four (4) cassettes and a fixture loading station having a means for gimballing a mated cassette and fixture. All stations are connected via a trolley which automatically moves cassettes between the stations. The loading station provides for a means for providing a gimbal movement to a fixture having a cassette mated thereon to provide for the loading of probes into fixtures in angles of up to 12° and in a non-grid-dependent manner. The cassette having cavities of at least 0.50 inch by 0.50 inch capable of holding of up to one hundred (100) probes.

16 Claims, 5 Drawing Sheets

AUTOMATIC PROBE FIXTURE LOADING APPARATUS WITH GIMBALLING COMPENSATION

BACKGROUND OF THE INVENTION

This invention pertains to an apparatus for loading test fixtures. In particular, an apparatus for automatically loading probes into test fixtures.

Test fixtures are commonly known and are used for testing printed circuit boards to verify electrical functionality and continuity between points on circuit boards. The test fixture usually includes an array of probes which are specially seated in the fixture so that one end of the probes are oriented to contact the specifically arranged circuits of printed circuit board. The other end of the probes are arranged to make contact with the specially designed pins of a testing apparatus. Generally, the pins of a test apparatus are spaced on a grid having 0.100 inch centers.

As the traces of printed circuit boards are becoming more and more miniaturized the probes within the fixture must be oriented within the fixture at an angle. Each printed circuit board has a customized design which requires the test fixture to be mated with that printed circuit board to also have a customized design.

Past fixture loading methods were slow because single-grooved probes had to be oriented properly within a cassette or fixture. Grooved pins have been disclosed in U.S. Pat. Ser. No. 07/683,872 and such grooves seat the probe within a fixture. The groove of the probe is used to provide a narrowed diameter which seats within an extended diameter area of a fixture. Due to the need for uni-directional or single-grooved probes to be positioned correctly within the fixture to provide for the proper seating of the probe, these single-grooved probes were required to be inserted by hand. As well, the manual insertion of probes was required in past fixture loading methods in order to assure the proper loading of probes into angled holes of the fixture, especially where the angles of the holes exceed 0.200 inch deflection. Other style probes are known which include "heads" or other outboard contours which are difficult to automatically load due to interlocking which may occur between adjacent probes.

It is common for probes to be constructed of music wire and have a length of approximately 3.00 inches. The long length of these probes allowed for increased deflection and reduced angling within a fixture; in that as the distance from the gridplate or bottom of the fixture to the personality plate or top of the fixture increases, the angle at which the probe is inserted into the fixture decreases while deflection capabilities increase. Thus, the use of long 3.00 inch probes is common in order to provide test fixtures for miniaturized printed circuit boards. Due to the aforementioned constraints, many of the prior art fixture loading methods were very slow and required excessive man-hours to load the fixtures.

It is a principle object of the present invention to provide a probe loading apparatus which operates automatically.

It is another object of the present invention to allow for the loading of probes at angles of up to 12 out of perpendicular with the fixture plate surface.

It is a further object of the present invention to provide for non-grid dependent cassettes.

It is another object of the present invention to provide for loading of a fixture through the bottom plate.

It is a further object of the present invention to programmably load multiple-sized probes in a single fixture.

It is another object of the present invention to provide cassettes which may load a minimum of four (4) fixtures without replenishment.

SUMMARY OF THE INVENTION

This invention provides an automatic probe loading apparatus having a replenish station, an elevator-cassette storage station and a gimbal station having a fixture arm and gimbal arm. The cassette arm and the gimbal arm mate in a vertical orientation. The cassette and fixture are rotated into a horizontal orientation. When the cassette is mated above the fixture, the probes of the mated cassette are gravity loaded via the gimballing action of the gimbal housing.

A probe cassette includes a non-grid-dependent orientation wherein multiple probes stored in a single cavity may be loaded into variably spaced grid holes above the fixture. The multiple probe loading cubicles may load up to four (4) different fixtures. The cubicles measure 0.050 inch square and may contain at least one hundred (100) probes.

The cassette is mated to the bottom gridplate of the fixture. Following loading of probes into the fixture, removal of the fixture from the automatic probe loading device occurs. A baseplate and mylar plate are added to the gridplate bottom of the fixture and seat the probes by aligning the groove of the pin with the small diameter mylar hole.

An embodiment of the invention loads probes in mass quantities into a series of plates with predetermined drilled holes which are located in such a way as to allow the probe to fall through the series of plates, from the top to the bottom regardless of probe to plate surface perpendicularity. The gravity fed probe transfer is enhanced by the fact that the probes are loaded through the bottom plate first rather than through the top plate which is the common method for other automatic loaders and manual loading methods. By loading through the bottom plate first the present invention can take advantage of holes which are typically larger in diameter, vis-a-vis probe diameter. On the top plate where probe pointing accuracy dictates hole to probe diameter relationships the holes are typically +/−0.004 inches. This makes conventional top plate loading "en mass" extremely difficult. Loading probes by this bottom first fashion allow for virtually any number of probes to be simultaneously loaded in a 4–5 minute time frame. The alternative is to load one probe at a time at rates up to 1000–1200 probes per hour. The present invention represents a throughput increase of 10 times or 15:1 over prior loading methods, with comparable time and money savings.

An embodiment of the invention uses hi-directional probes. This feature eliminates the time consuming orientation of probes, prior to loading, and the elimination of "miss-loads" caused by probes being out of orientation. Also, during fixture breakdown when loaded probes are removed from the fixture, the reorientation of probes prior to being replaced into the cassette is eliminated. Prior fixturing and loading systems utilize uni-directional probes which constantly have to be orientated to ensure they are all in the correct direction.

An embodiment of the invention uses a cassette with four hundred (400) probes per square inch (non-grid-dependent) to populate fixtures as opposed to the prior loading cassettes having one hundred (100) probes per square inch (grid-dependent), or one pin per grid hole on 0.100 inch centers. The one probe per grid hole prior art methods result in the operator being unable to build more than one fixture without replacing the removed probes back into the vacated 0.100 inch grid hole locations of the cassette. With the method of the present invention, multiple fixtures can be loaded with no cassette replenishment necessary. This is due to the fact that the fixture has one hundred (100) grid holes per square inch maximum, while the cassette which mates to the fixture has as many as four hundred (400) probes per square inch. This permits a minimum of four (4) fixtures to be built with no cassette replenishment, assuming every fixture grid hole was loaded. When less than every fixture grid hole is required even more fixtures can be sequentially loaded.

An embodiment of the invention uses a programmable storage elevator and transport system to store and transport cassettes into and out of the various stations automatically without manual intervention. This allows the operator' to load multiple style probes having differing diameters without having to manually lift and position heavy, (up to 200 lbs.) cassettes in order to change probe diameters. This unique feature represents not only significant time savings but also represents a much safer, secure working environment.

An embodiment of the invention can load probes with up to 0.400 inch deflection. Utilizing a programmable gimbal system, probes which are resident in a cassette (vertical square tubes), can be loaded into fixtures with angles up to 12° out of perpendicularity (relative to the fixture plate surface). Prior loading systems simply agitate with vibration to assist in the gravity transfer of probes from the cassette to the fixture and are unable to accommodate; deflections greater than 0.250 inches. The present invention has the unique capability to gimbal the fixture in all four (4) axes allowing drilled holes in the fixture to align themselves with the relatively vertical probes in the cassette. This unique feature allows for a smooth transfer of probes from cassette to fixture even under maximum deflection conditions.

A fixture can have holes drilled in a multitude of plates with varying separations within the prescribed fixture overall thickness. These holes may or may not be drilled in similar "X" and "Y" positions (relative to a common datum) on each plate. As the bottom fixture plate shall always be on a specific grid (0.100 inch, 0.050 inch, etc.) and the top plate may or may not be on a specific grid or at least a similar grid, some probe deflection is usually required. Drilling holes in each plate at different calculated "X" and "Y" coordinates result in the creation of an angular path relative to the fixture top plate surface. This path allows the probe to fall uninterruptedly through all plates, connecting the top plate location to the bottom plate locations. When one attempts to automatically load this type of fixture with prior art cassette, eggcrate or other probe storage devices where probes are stored in a relatively vertical position, the following problems arise. Probes wanting to follow this angular path of the fixture either quickly run out of free moving space or start at a hole that is already at the limit of free probe movement pursuant to the desired direction of angle and therefore will not load freely.

The present invention utilizes a gimbal approach which tilts the fixture in all four (4) axes in order to convert any angular paths to perpendicular paths vis-a-vis probes in cassette. This not only permits free probe transfer but also permits probes on significant angular paths to be loaded. With one system any degree or angular path can be theoretically accommodated simply by increasing the gimbal angle. Competitive systems are limited to 0.200 inch deflection. This capability is very important due to the wide acceptance of smaller and smaller pitch surface mount devices, resulting in greater and greater grid differential (top to bottom), requiring more and more deflection capabilities. The cavities in which the probes are stored in the "cassettes" have to be large enough to store a multitude of probes (up to 9300) freely without binding. However the cavities must also be small enough to prevent the probes from leaning more than 15°. Probes leaning more than 15° can easily become tangled with other probes in the same cavity causing a "rats nest" effect. The grid may include cavities approximately 0.500 inch square.

These and other features of the invention are set forth below in the following detailed description of the presently preferred embodiments.

DETAILED DESCRIPTION OF THE PRESENTLY PREFERRED EMBODIMENTS

Figure 1:
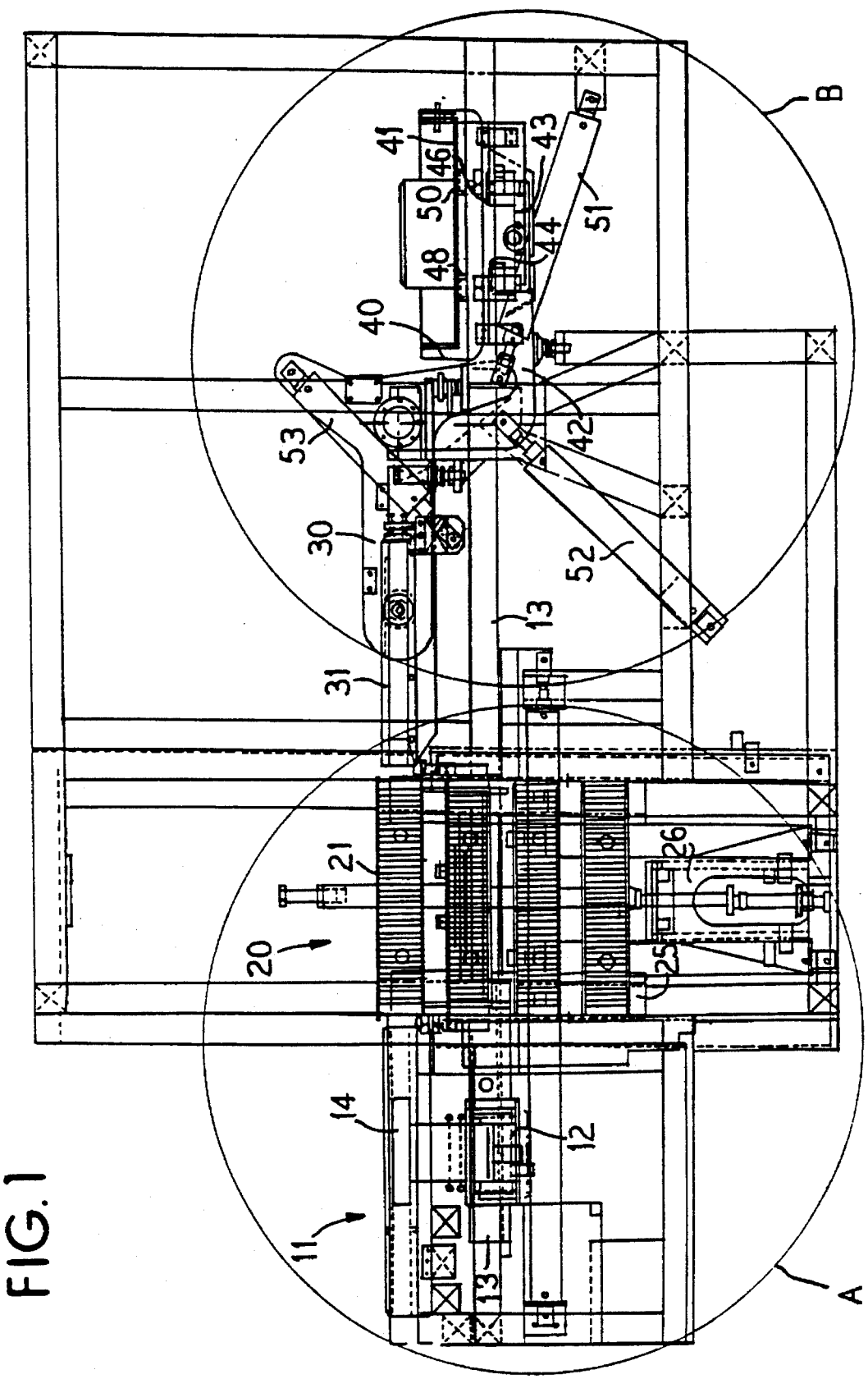
FIG. 1 is a side elevation view of an automatic probe loading apparatus.

FIG. 1 shows an apparatus which is generally split into Area A and Area B. Area A includes a replenish station 11 and an elevator-cassette storage station 20. Area B is a fixture loading area.

The replenish station 11 includes a trolley 12 which rides on a trolley track 13. The trolley 12 is connected to a cassette holder 14 which supports and holds a cassettes 21,22,23,24. The replenish station 11 allows for cassettes 21,22,23,24 to be removed from the elevator cassette storage station 20 via the trolley 12. Probes may then be loaded into the cassettes 21,22,23,24.

The elevator-cassette storage station 20 includes an elevator rack 25 which supports cassettes 21,22,23,24. The elevator rack may be moved up or down in a vertical direction via pneumatic lift 26. The vertical movement of the elevator rack allows for positioning of a cassette adjacent to the cassette holder 14 of the trolley 12. In FIG. 1, cassette 21 is shown at a vertical orientation adjacent to cassette holder 14. In this orientation, the trolley 12 can move along trolley track 13 so that the cassette holder 14 is engaged with cassette 21. The cassette may then be carded horizontally to either the replenish station 11 or the fixture loading Area B. In a preferred embodiment of the invention, the elevator rack 25 holds four (4) cassettes 21,22,23,24. However, it is anticipated by this invention that more or less cassettes may be contained within the elevator cassette storage area 20.

The fixture loading Area B includes trolley track 13 which allows for movement of the cassettes between Area B and the elevator-cassette storage station 20. Cassette arm 30 includes cassette guides 31. The cassette guides 31 receive the cassettes onto the cassette arm 30. In FIG. 1 it is shown that cassette 21 is adjacent to cassette guides 31 and cassette arm 30. A cassette 21 loaded with probes is moved onto cassette guides 31 via the horizontal movement of trolley 12 under the cassette arm 30. Gimbal housing 40 includes fixture tray 41. The gimbal housing 40 is supported by gimbal arm 42. Also attached to gimbal arm 42 is agitation means 43 which includes gimbal cylinders 44,46 and gimbal pads 48,50. Gimbal arm 42 and cassette arm 30 are controlled and moved via pneumatic cylinders 51,52 and 53.

Figure 2:
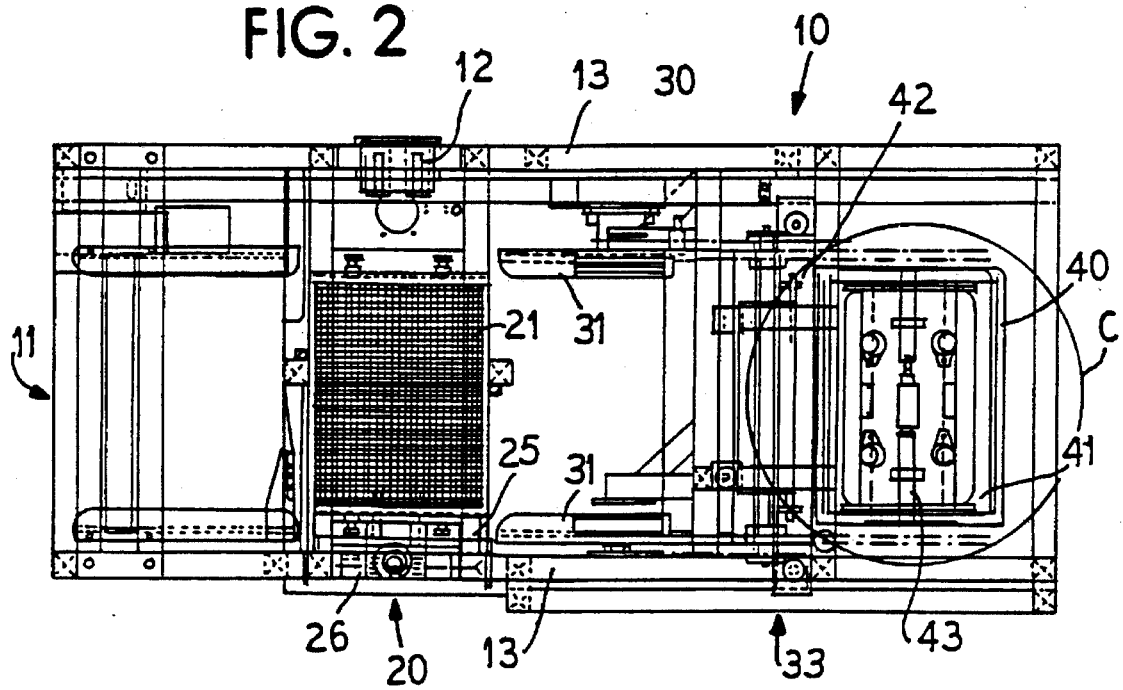
FIG. 2 is a plan view of the apparatus of FIG. 1.

FIG. 2 is a plan view of the automatic probe fixture loading device 10. The replenish station 11 is adjacent to elevator cassette storage station 20 which includes cassettes 21, elevator racks 25 and pneumatic lift 26. The trolley 12 is on trolley track 13. The fixture loading station 33 is shown having cassette arm 30 and cassette guides 31. Gimbal arm 42 is shown adjacent to agitation Area C. Included in agitation Area C is gimbal housing 40 and gimbal tray 41, agitation means 43 and gimbal pads 48,49,50,51.

Figure 3:
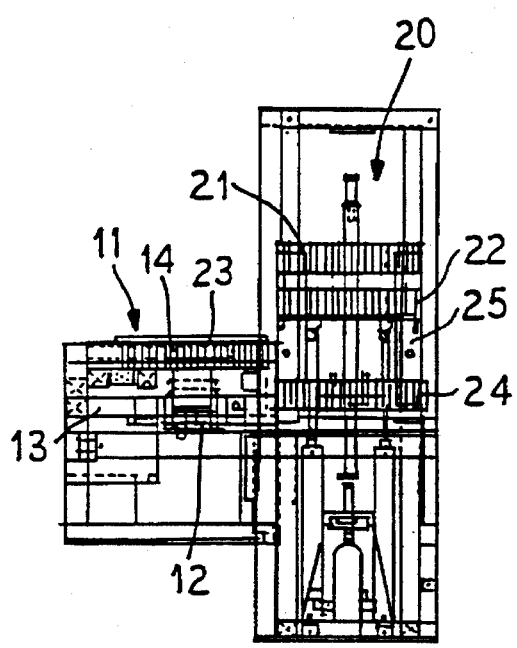
FIG. 3 is a side elevation view of a specific operation of Area A of FIG. 1.

The probe loading system of the present invention is accomplished by the steps shown in FIGS. 3–7 and FIGS. 9 and 10. FIG. 3 is a side elevation view of only area A of FIG. 1. Shown in this view are replenish station 11 and elevator cassette storage station 20. The elevator rack 25 is shown elevated from its position in FIG. 1 wherein cassette 23 has been elevated so that it is adjacent to the trolley holder 14 and has been moved horizontally by the trolley 12 along trolley track 13 into the replenish station 11. While the cassette 23 is in replenish station 11, the top of the cassette is exposed allowing an attendant to manually insert probes into the cavities of the cassette 23. In a preferred embodiment, the elevator cassette storage area 20 can store up to four (4) cassettes 21,22,23,24. These cassettes will each hold probes of different diameters. For example, in a preferred embodiment, cassette 21 would hold 0.019 inch diameter probes, cassette 22 would hold 0.023 inch diameter probes, cassette 23 would hold 0.032 inch diameter probes and cassette 24 would hold 0.052 inch diameter probes. A single test fixture requires different diameter probes. Thus, in a preferred embodiment each individual fixture will in sequence be mated with the different cassettes containing the different diameter probes. Thus, in the replenish station 11, only one particular diameter probe will be loaded into the cavities of particular cassette 23.

Figure 4:
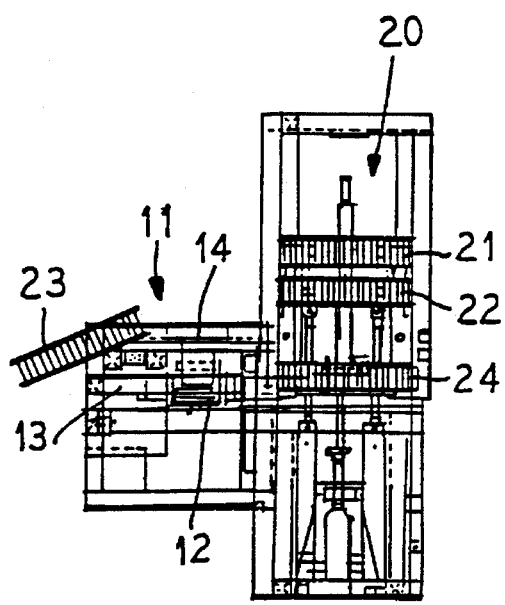
FIG. 4 is a side elevation view of another specific operation of Area A of FIG. 1.

FIG. 4 shows that the cassette 23 may be tilted so that the top of the cassette 23 is more easily viewed and the attendant may look down into the cavities more easily to check to be sure that all of the cavities are filled and that no remaining probes may be inserted therein. The probes are hi-directional probes having grooves at each end, one of which will seat the probe within the test fixture. The double grooved or hi-directional probes allow the attendant to insert the probe in either direction which allows for quick loading of the cassettes. The cassette 23 is then placed back onto cassette holder 14 and the trolley 12 moves horizontally to the elevator cassette storage station 20. The other cassettes 21,22,24 may then be moved to the replenish station 11 for replenishment of different diameter probes.

Figure 5:
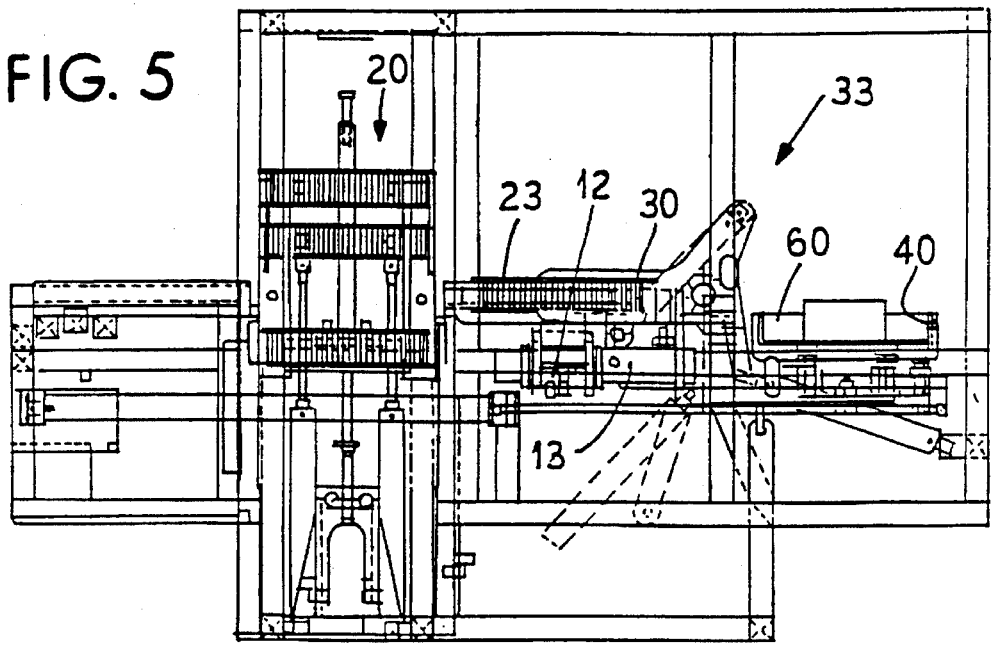
FIG. 5 is a side elevation view of a further operation.

FIG. 5 shows a side elevation view of the entire automatic probe loading apparatus 10. Fixture loading station 33 receives the cassette 23 onto cassette arm 30 by moving it horizontally from the elevator cassette storage station 20 along the trolley track 13 via trolley 12. This moves the cassette 23 into position to be mated with the gimbal housing 40 and fixture 60.

Figure 6:
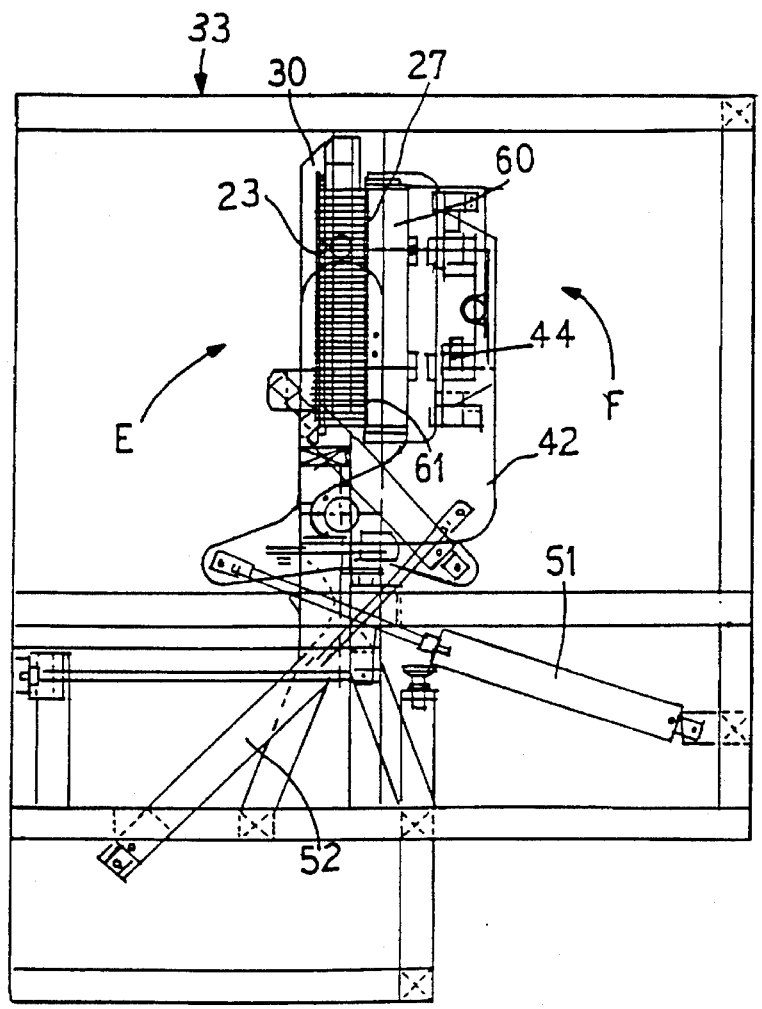
FIG. 6 is a side elevation view of an operation of Area B of FIG. 1.

FIG. 6 shows a side elevation view of fixture loading station 33 as shown as Area B of FIG. 1. It is shown that the cassette 23 is mated with the fixture 60. This mating occurs by moving the cassette arm 30 and gimbal arm 42 into a vertical position. The cassette arm 30 is moved in direction of arrow E from its horizontal position to the vertical position. This movement is accommodated by the extension of pneumatic cylinder 51. The gimbal arm 42 is moved in direction of arrow F into its vertical position. This is accommodated by the expansion of pneumatic arm 52. The mating occurs between the cassette 23 and the fixture 60 so that the top openings 27 of cassette 23 are flush with the or bottom plate 61 of the fixture 60.

Figure 7:
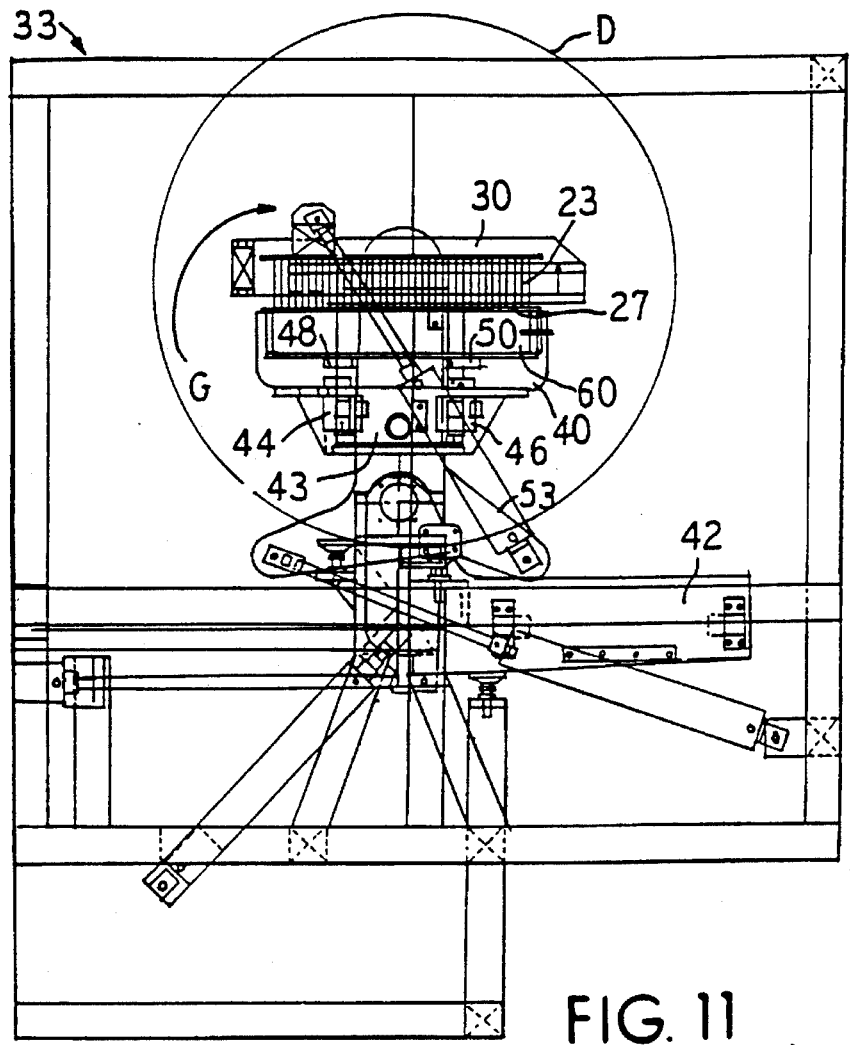
FIG. 7 is a side elevation view of another operation of Area B of FIG. 1.

FIG. 7 also shows a side elevation view of fixture loading station 33 showing the movement of the mated cassette 23 and fixture 60 into a horizontal position. Gimbal arm 42 is returned to its horizontal position, leaving the gimbal housing 40, agitation means 43 and fixture 60 mated to cassette 23. The cassette arm 30 is then moved into a horizontal position by rotation in direction of arrow G by the expansion of pneumatic cylinder 53. This orients cassette 23 in an inverted position with the top opening 27 of the cassette 23 upsidedown so that the contents of the cassette 23 may be gravity fed into the fixture 60. Area D is the agitation area and is more closely shown in FIG. 10 and 11. Agitation of the cassette 23 occurs via the gimballing action directed to the fixture 60 via the gimbal cylinders 44,46 and the gimbal pads 48,50. These provide for the gimballing of the mated fixture 60 and cassette 23 which agitates the probes contained in the cassette 23 sufficiently to load the probes into the holes of the fixture 60.

Figure 8:
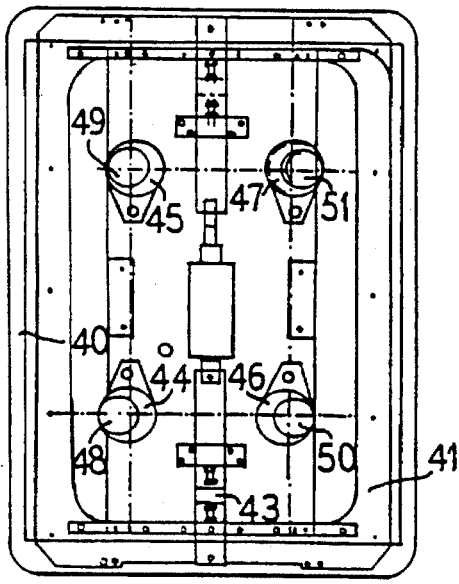
FIG. 8 is a plan view of Area C of FIG. 2.

FIG. 8 is an enlarged view of Area C of FIG. 2 showing the gimbal housing 40, gimbal tray 41, the gimballing means 43 and gimbal pads 48,49,50,51 which are above the gimbal cylinders 44,45,46 and 47. The gimbal pads 48,49,50,51 support the gimbal tray 41.

Figure 9:
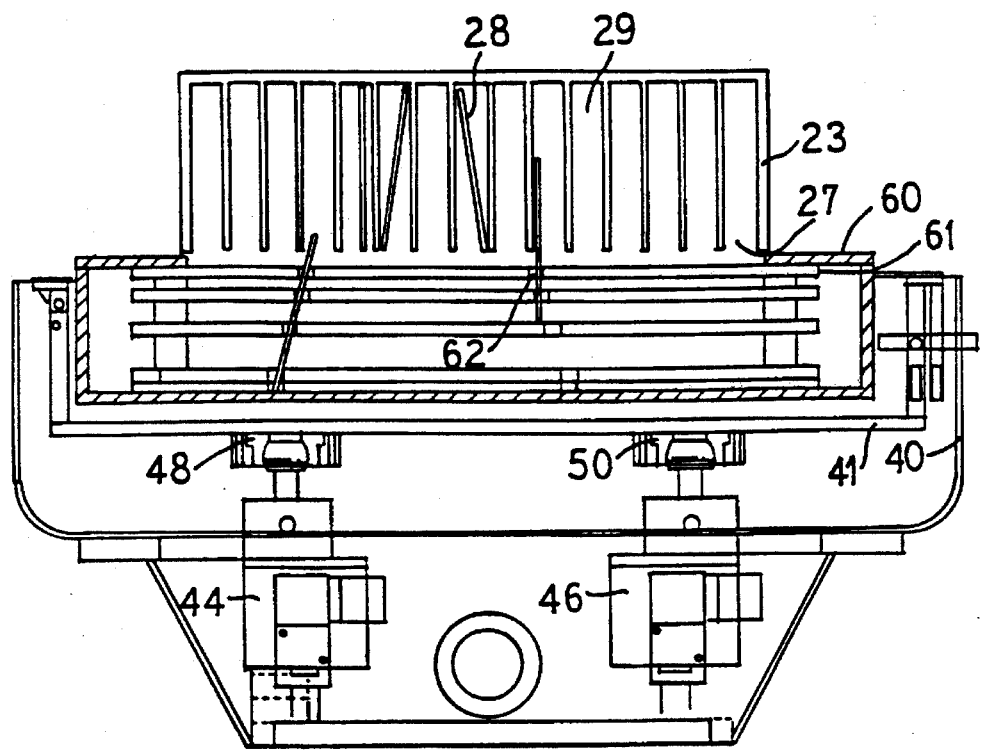
FIG. 9 is an enlarged side elevation view of Area D of FIG. 7.

FIG. 9 is an enlarged view of Area D of FIG. 7 showing the agitation process of the present invention. Test fixture 60 is shown mated with cassette 23. The fixture 60 rests on gimbal tray 41 which is supported within gimbal housing 40. The gimbal tray 41 rests on gimbal pads 48,50 which are connected to gimbal cylinders 44,46. The cassette 23 is in an inverted position so that the top openings 27 are in open communication with the bottom plate 61 of the fixture 60. The pins 28 are contained within cavities 29 of the cassette 23. In a preferred embodiment, the cavities 29 have a dimension of 0.50 inch square which may hold as many as one hundred (100) probes, thus as many as 400 probes per square inch are accommodated by the cassette 23. The probes 28 are gravity fed into holes 62 of the gridplate bottom 61 of the fixture 60. The mating of the pins 20,28 with holes 62 is accomplished due to the gimballing affect of the present invention as shown in FIG. 10.

Figure 10:
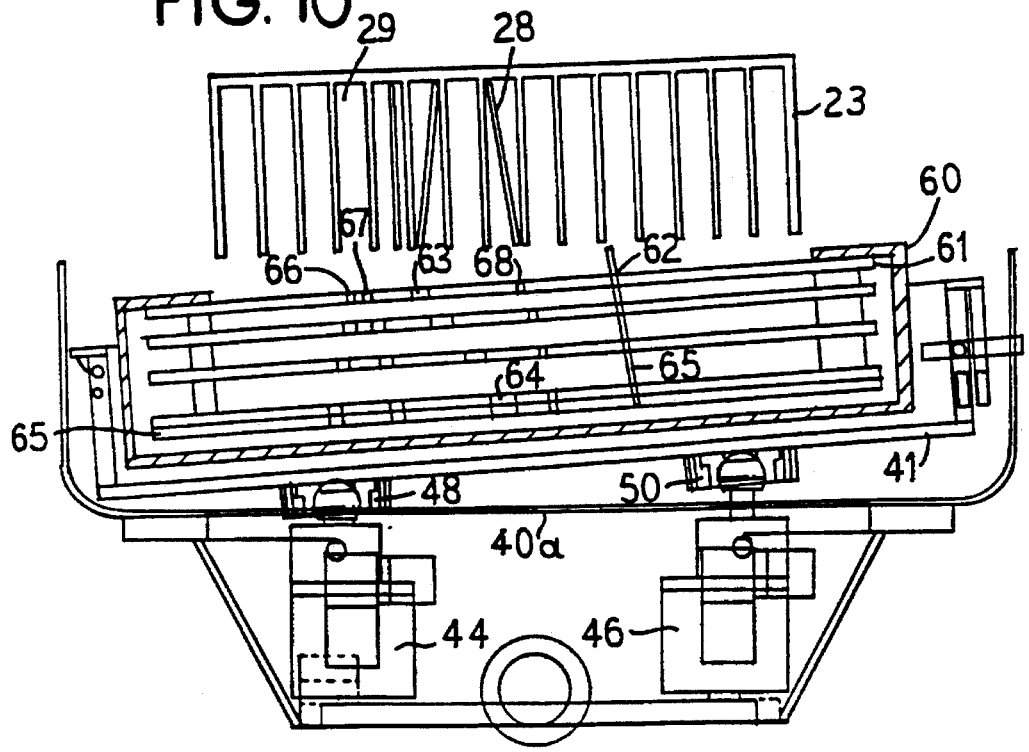
FIG. 10 is an enlarged side elevation view of the operation of Area D of FIG. 7.

FIG. 10 demonstrates how the gimballing mechanism of the present invention via the pneumatic or gimbal cylinders 44,46 cause the gimbal pads 48,50 to independently elevate and lower causing the gimbal tray 41 to gimbal the fixture 60 in all four (4) axes while the cassette remains stationary relative to the original position. The gimballing of cassette 23 agitates the probes 28 in order to provide for probes 65 to be completely inserted into the hole 62 of fixture 60. As there are four (4) gimbal pads 48,49,50,51 (FIG. 8) which move independently from each other gimbal pad, in a vertical direction and at different frequencies, a gimbal action is imparted only to the fixture 60 while cassette 23 remains stationary. This gimbal system provides for many unique advantages of the present invention. It is common for fixture 60 to include holes such as 63 which are off-set within the fixture 60 so that the first hole 63 in the bottom plate 61 and the last hole 64 in the top plate 65 may be at an angle up to 12° out of perpendicularity, relative to the fixture plate surfaces. The gimballing action of the present invention allows for the gravity feeding of probes 28 into such greatly angled holes 63,64. By gimballing or tilting the fixture 60 so that hole 63,64 is perpendicular to the horizontal or the base of the gimballing tray 40a the gravity fed probe 28 will easily be loaded in hole 63,64 of fixture 60.

The loading system of the present invention also provides for the easy loading of fixture 60 in that the loading of probes is done through the bottom plate 61. Generally, the holes 63 of the bottom plate 61 have a larger diameter than the holes 64 in the personality plate-top 65. Thus, the loading of probes 28 through the bottom plate 61 provides for loading "en mass" and in a preferred embodiment of the invention the loading of any number of probes into a fixture 60 may be accomplished simultaneously in a four (4) to five minute time-frame.

Further, the large size of the cavities 29 being 0.50 inch square provides for the loading of multiple holes 66,67 of fixture 60 from a single cavity 29. For example, both holes 66,67 can be loaded from a single cavity 29. These holes 66,67 are on a standard grid of the gridplate 61. The holes 66,67 are generally spaced on 0.100 inch centers providing for the uniform grid. In prior art loading fixtures each hole 66 would correspond with an individual cavity containing a single probe. Thus, once the loading of that single hole 66 occurred, the cavity containing the single probe would be empty and after the single loading, the entire cassette would need replenishing. However, in the present invention, the cavities 29 hold up to one hundred (100) probes which may load multiple holes 66,67 of a single fixture 60 at one time from a single cavity. Further, the cassette 23 may be used over and over to load different fixtures due to the large capacity of the cavities 29 of the fixture 23. A maximum width of the 0.50 inch square cavities 29 is needed in order to limit the leaning of the probes 28 within the cavities 29 to 15° or less. The leaning of a probe 28 of an angle more than 15° provides for the tangling of probes within a cavity 29. These probes 28 which are leaning on a 15° angle are displaced easily from the cassette 23 due to the gimbal system of the present invention.

A further advantage of the present invention is understood by comparing holes 63,67 and 68 of the gridplate 61. It can be seen that each of these holes has a different diameter. In a preferred embodiment, the hole 67 has a diameter of 0.023 inches, hole 63 has a diameter of 0.019 inches and hole 68 has a diameter of 0.032 inches. It is common for a fixture 60 to contain holes of different diameters. These holes correspond and mate with probes of different diameters. The present invention contains multiple cassettes 21,22,23,24 which each hold different diameter sized probes. Each cassette 21,22,23,24 is simultaneously mated with a single fixture 60 so that the different sized probes of each cassette 21,22,23,24 can be loaded into the different diameter sized holes 67,63,68 of fixture 60. The automatic system of the present invention including the elevator storage station 20 and the trolley system 12 provide for the automatic movement of cassettes 21,22,23,24 to easily accommodate the loading of different sized probes to a single fixture 60. In a preferred embodiment of the invention, the probes are loaded in order of the largest diameter probes first and the smallest diameter probes last. This assures that the holes of the fixture 60 are loaded properly with the proper diameter probe.

For example, large diameter probes will successfully fall into large diameter hole 63. But the same large diameter probe will not be able to penetrate small diameter holes 67,68. Thus, the fixture 60 is first loaded with probes 65 which fill the large diameter holes 62,63. The cassette 23 is then disengaged from the fixture 60 and returned to the elevator storage area 20 and a new cassette with smaller diameter probes is moved into fixture loading area 33 and mated to the fixture 60. Holes 62,63 will already be filled with large diameter probes. The empty holes 67,68 will then accommodate the loading of the smaller diameter probes of the new cassette. This process continues by bringing the cassette containing the next smaller diameter sized probes to mate with the fixture 60 so that all of the holes 62,63,66, 67,68 are loaded. By loading large diameter probes first with subsequent smaller sizes to follow, the need for drilled "masks" which restrict smaller probes from entering a large hole is eliminated.

The large size of the cavities 29 which correspond to multiple holes 66,67 of the grid are non-grid-dependent. These non-grid-dependent cavities 29 may load multiple holes of the grid simultaneously. The non-grid-dependent cassettes 23 provide for much quicker loading of fixture 60 and allow for loading of multiple fixtures without the need of replenishing the cassette 23. It is common for the gridplate 61 to contain one hundred (100) grid holes per square inch. Because the cassette 23, in a preferred embodiment, contains up to 400 probes per square inch, a single cassette could load as many as four (4) fixtures 60 without replenishment. If the grid plate 61 had holes in a grid of less than one hundred (100) grid holes per square inch, then the replenishment rate of the cassette 23 would be even less.

Once the fixture 60 is mated with the appropriate number of fixtures 21,22,23,24, the fixture 60 will be completely populated and upon unmating of the fixture 60 a final cassette will be returned to its resting position (FIG. 1) and the fixture 60 may be removed from the automatic probe loading machine 10. The fixture 60 is then placed on a flat surface with the bottom plate 61, side facing up. A base plate and mylar sheet is then attached to the fixture 60. The attachment of the base plate and mylar sheet seats the probes into the fixture 60. The probes have grooves or reduced diameter areas machined 0.200 inches from each end of the probe. The area above the groove remains flush or sub-flush to the top of the fixture 60. The grooves of the probes in a preferred embodiment of the invention generally have a reduced diameter area of from 0.044 inches to 0.014 inches. The mylar film is correspondingly drilled to have holes of diameter 0.0453 inches to 0.018 inches. The mylar film and base plate are attached to the fixture 60 and the fixture 60 is inverted. A carder plate (not shown) which is adjacent to the top plate 65 is removed exposing the protruding probes above the top plate 65. The probes are then pushed down into the mylar film and base plate. The mylar holes stretch around the end of the probe having a diameter of 0.052 inches to 0.019 inches. The mylar is then seated into the grooves or reduced diameter area of the probes and engages the probe so that it is securely held within the fixture.

The seating of the probes into the mylar film and base plate may occur after the loading of the probes in the automatic probe loader due to the bi-directional, dual grooved probes used in the present invention. As it is necessary that a grooved end of a probe protrude from the bottom plate of the fixture for proper seating of the probe within the fixture, the probes used are bi-directional probes having grooves at each end. Thus, when the probes are manually loaded into the cassettes 23 in the replenish area 11 (FIG. 3) the probes may be inserted in either direction into the cassette 23. Because the probes have grooves on each end it does not matter which way they are inserted into the cavities 29 of the cassette 23. The bi-directional probes will be loaded into the fixture 60 from the cassette 23 so that a groove is at the bottom plate 61 of the fixture 60, regardless of which direction the probe was inserted into the cavity 29 of the cassette 21,22,23,24 in the replenish area 11. The use of the hi-directional probes allows for the quick loading of the probes into the cassettes at the replenish station 11.

Figure 11:
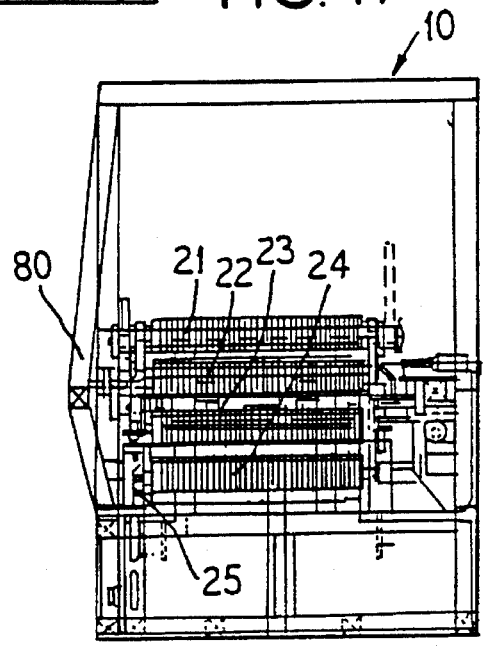
FIG. 11 is an end elevation view.

FIG. 11 is an end view of the automatic probe loader 10. Elevator rack 25 is shown supporting cassettes 21,22,23,24. Attendant viewing and control area 80 is shown. The automatic probe loader 10 includes computerized control means wherein all processes of the loading may be sequentially controlled and pre-programmed at viewing control area 80.

The description above has been offered for illustrative purposes only, and it is not intended to limit the scope of the invention of this application which is defined in the following claims.

I claim:

1. An automatic probe fixture loading apparatus comprising:

a replenish station;

an elevator-storage station connected to said replenish station;

a fixture loading station connected to said elevator-storage station and including means for mating a cassette to a fixture; and a gimballing station which provides agitation by the movement of the fixture in a vertical direction.

2. The loader apparatus of claim 1 wherein said fixture is loaded through a bottom plate.

3. The loader apparatus of claim 1 wherein said cassette is non-grid-dependent.

4. The loader apparatus of claim 1 wherein said cassette includes cavities of 0.50 inch by 0.50 inch or less.

5. The loading apparatus of claim 1 wherein said cassette is loaded with bi-directional probes.

6. The loader apparatus of claim 1 wherein said cassette includes cavities which allow for the maximum leaning of probes of 15° relative to the cavity walls.

7. The loader apparatus of claim 1 wherein said cassettes are loaded with probes having a length of 3.00 inches.

8. The loader apparatus of claim 1 wherein said elevator storage area includes means for containing four (4) cassettes.

9. The loader apparatus of claim 1 wherein said cassette includes cavities having a dimension of 0.50 inch by 0.50 inch.

10. An automatic fixture loading apparatus comprising:

a gimbailing station providing a means for mating a cassette to a fixture and agitation of said fixture in a vertical direction;

said fixture including a grid of holes providing for the non-perpendicular orientation of probes loaded therein;

cavities contained within said cassette; and said cavities being non-grid-dependent.

11. The loader apparatus of claim 10 wherein said cavities have a dimension of at least 0.50 inch by 0.50 inch.

12. The loader apparatus of claim 10 including an agitator coupled to said means for mating said cassette and fixture so that probes in said cassette gravity feed into said fixture.

13. A method of loading probes automatically into test fixtures including the steps comprising of:

loading probes into a cassette;

moving the cassette into a fixture loading station;

mating said cassette to a fixture;

orienting said mated cassette and fixture in a horizontal orientation so that the cassette is inverted over the fixture;

agitating said fixture sufficiently via a gimbailing movement of said fixture in a vertical direction to load probes into said fixture;

disengaging the mated cassette and fixture; and removing said loaded fixture from said apparatus.

14. The method claim 12 wherein said fixture is mated so that the bottom grid of said fixture abuts said cassette.

15. An automatic fixture loading apparatus comprising:

a fixture including a grid of a plurality of holes wherein a number of said corresponding holes being non-perpendicularly aligned;

a cassette including cavities; and a gimbailing station providing a means for mating said cassette to said fixture and loading said holes of said fixture via gravity feeding and agitation in a vertical direction.

16. The loader apparatus of claim 1 wherein said gimballing station includes gimbal cylinders at each corner of said fixture providing for the independent sequential up and down movement of each of said corners.

* * * * *